United States Patent [19]

Im

[11] Patent Number: 5,184,045
[45] Date of Patent: Feb. 2, 1993

[54] MAGNETRON FOR A MICROWAVE OVEN HAVING A PAIR OF CHOKE COILS WOUND AROUND A CORE IN THE SAME DIRECTIONS

[75] Inventor: Jong H. Im, Daeku, Rep. of Korea

[73] Assignee: Goldstar Co., Ltd., Seoul, Rep. of Korea

[21] Appl. No.: 511,756

[22] Filed: Apr. 20, 1990

[51] Int. Cl.$^5$ .............................................. H01J 23/14
[52] U.S. Cl. .................................... 315/39.51; 315/85
[58] Field of Search .................. 315/39.51, 39.53, 85; 333/177, 181, 182

[56] References Cited

U.S. PATENT DOCUMENTS

| | | |
|---|---|---|
| 2,692,372 | 10/1954 | Goldstine .......................... 333/181 |
| 4,164,685 | 8/1979 | Takahasi ....................... 315/39.51 X |

FOREIGN PATENT DOCUMENTS

| | | | |
|---|---|---|---|
| 0225335 | 11/1985 | Japan | 315/39.51 |
| 0263029 | 11/1986 | Japan | 315/39.51 |
| 0117241 | 5/1987 | Japan | 315/39.51 |

*Primary Examiner*—Eugene R. LaRoche
*Assistant Examiner*—Seung Ham
*Attorney, Agent, or Firm*—Birch, Stewart, Kolasch & Birch

[57] ABSTRACT

A magnetron for a microwave includes a pair of choke coils wound around only one core in same direction thereby forming a unique type choke coil. Ends of the unique type choke coil are connected among a lead-through capacitor, a center lead and a peripheral lead respectively so that the filter circuit includes jointly the unique choke coil. As a result, the magnetron can eliminate radio frequency noise, reduce the heating caused from a power supply, and reduce the volume of the filter box.

2 Claims, 3 Drawing Sheets

MAGNETRON FOR A MICROWAVE OVEN HAVING A PAIR OF CHOKE COILS WOUND AROUND A CORE IN THE SAME DIRECTIONS

BACKGROUND OF THE INVENTION

1. Field of the Invention

The present invention relates to a magnetron for a microwave oven and more particularly, to a magnetron for a microwave oven in which a filter circuit of the input side is improved for saving the manufacturing material therefor and miniaturizing a filter box.

2. Description of the Prior Art

Generally, a conventional magnetron for a microwave oven includes, as shown in FIGS. 1 and 2, a low pass filter circuit containing choke coils 5 and 5' connected to a center lead 3, respectively, a peripheral lead 4 connected to the upper and lower end shields 1 and 2, respectively which apply power supply thereto and a lead-through capacitor 6 connected to the choke coils 5 and 5'. The filter circuit eliminates radio frequency noise which is generated from an operating space 7 and flowing inversely through a filament 8 to the input side.

As shown in FIG. 3A, the filter circuit has a configuration that a first filter containing a first choke coil $L_1$ and a first capacitor $C_1$ and a second filter containing a second choke coil $L_2$ and a second capacitor $C_2$ are connected to each end of a filament F, respectively. The filters can be expressed by an equivalent circuit as shown in FIG. 3B, in which input terminals A and B are connected to output terminals A' and B' of the filament F through the choke coils $L_1$ and $L_2$, respectively and the input terminals A and B are connected to a ground terminal G through the capacitors $C_1$ and $C_2$, respectively. A noise signal Vn of the radio frequency generated from the operating space 7 can be expressed as shown in FIG. 3C, that it is applied between the filament F and the ground terminal G.

Therefore, the noise signal Vn passes through the filament F and then feedback to the input terminals A and B through the first filter of the first coil $L_1$ and the first capacitor $C_1$ and the second filter of the second coil $L_2$ and the second capacitor $C_2$, respectively wherein the radio frequency is blocked at the filter circuits.

On the other hand, when the noise voltage becomes a voltage between both input terminals A and B, the voltage between the input terminals A and B becomes a form of $V_{AB} = V_{AG} + V_{GB}$, because $V_{BG} = -V_{GB}$, and when values of $V_{AG}$ and $V_{BG}$ are similar, the voltage value between the input terminals A and B according to the noise signal Vn becomes further more decreased.

Wherein $V_{AG}$ is a voltage between the input terminal A and the ground point G, and $V_{BG}$ is a voltage between the input terminal B and the ground point G.

According to the conventional filter circuit, the magnitude of cores 9 and 9' and winding number of the coils 5 and 5' cannot be decreased in order to keep respective magnetic inductive coefficients of the choke coils 5 and 5' disposed at two places and the heating of the cores 9 and 9' by inducing heat caused from inputting power is inevitable. Therefore, it is intended to prevent the heating by inducing heat by keeping predetermined distance intervals among the coil windings when the choke coils wind. However, the magnitude of a filter box 10 is increased as a result of this compensation.

Consequently, such conventional magnetrons for microwave ovens have a number of disadvantages that manufacturing cost of the magnetron is increased and its volume is also greatly increased.

SUMMARY OF THE INVENTION

Accordingly, it is an object of the present invention to provide an improved magnetron for a microwave oven for eliminating the radio frequency noise by utilizing a unique type choke coil, decreasing the heat produced by the power, and making possible to decrease the volume of the filter box.

Another object of the present invention is to provide an improved magnetron for a microwave oven, which includes a unique type choke coil provided, respectively, with an input terminal and an output terminal at the upper and lower ends by winding a plurality of choke coils onto one core, wherein the unique type choke coil is connected between the center lead and peripheral lead and the lead-through capacitor so that the filter circuit commonly owns the unique type choke coil.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Briefly described, the present invention relates to a magnetron for a microwave comprises a pair of choke coils wound around only one core in same direction thereby forming a unique type choke coil and ends of the unique type choke coil connected among a lead-through capacitor and center lead and peripheral lead respectively s that the filter circuit includes jointly the unique choke coil, whereby the magnetron can eliminate the radio frequency noise, reduce the heating causing from power supply, and reduce the volume of the filter box.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 3A to 3C diagrammatically show the conventional filter circuit, in which;

FIGS. 5A to 5D diagrammatically show the filter configuration and its circuits according to the present invention, in which;

FIG. 5A is a diagram of the filter circuit of the present invention;

FIG. 5B is a diagram of an equivalent circuit of FIG. 5A

FIG. 5C is a diagram of an equivalent circuit of the inductor according to FIG. 5B; and FIG. 5D is a diagram of an equivalent circuit according to the noise signal.

DESCRIPTION OF THE PREFERRED EMBODIMENTS

Figure 1:
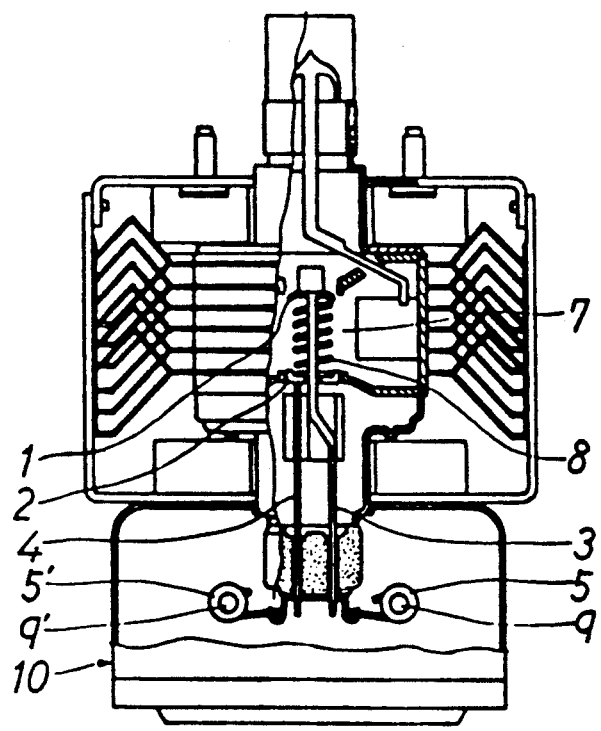
FIG. 1 is a cross sectional view of a conventional magnetron containing cut away portions in order to illustrate the construction thereof.
Figure 2:
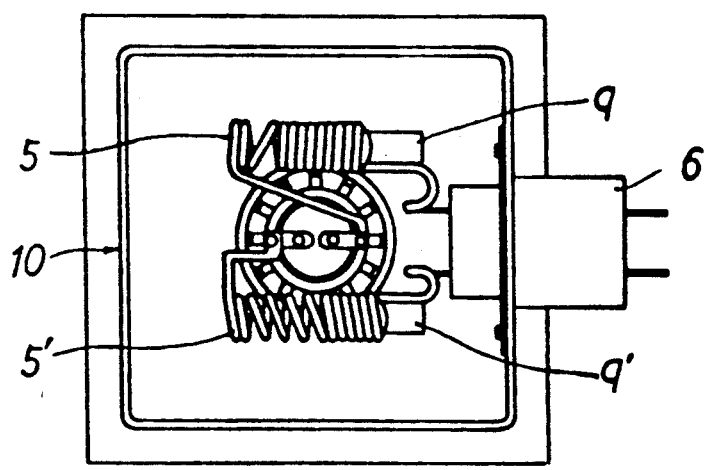
FIG. 2 is a top plane view of the filter box of FIG. 1.
Figure 4:
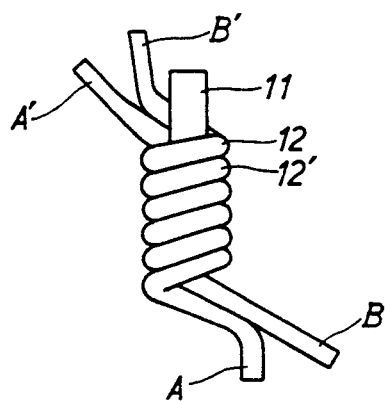
FIG. 4 is a perspective view of a choke coil according to the present invention.

Referring now in detail to the drawings for the purpose of illustrating preferred embodiments of the present invention, the magnetron for a microwave oven as shown in FIG. 4, includes choke coils 12 and 12' wound around a core 11 adjacent together, and input terminals A and B and output terminals A' and B' at the upper and lower ends, respectively, wherein the input terminals A and B of choke coils 12 and 12' are connected to the lead-through the capacitor 6 as shown in FIGS. 1 and 2, and the output terminals A' and B' are connected to the center lead 3 and the peripheral lead 4, respectively.

The pair of the choke coils 12 and 12, are wound in same direction so that their magnetic inductive coefficients are counterbalanced.

Figure 3A:
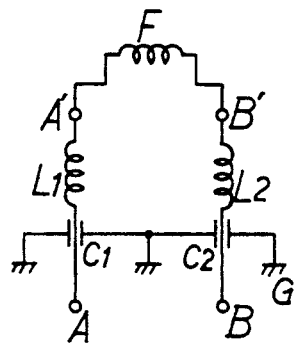
Figure 3B:
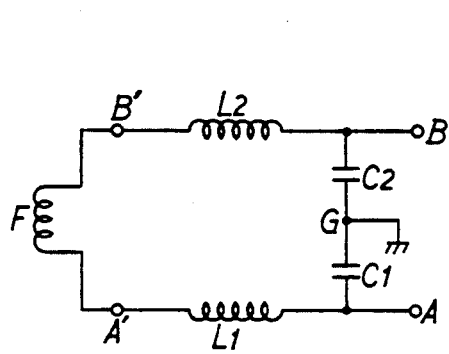
Figure 3C:
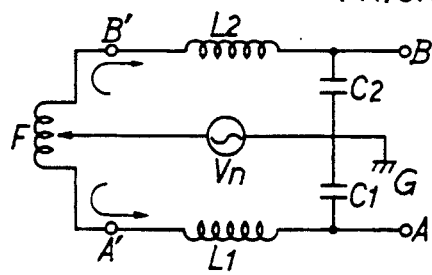
Figure 5A:
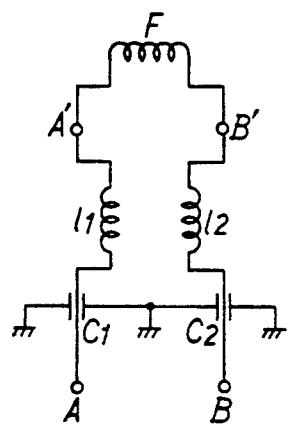
Figure 5B:
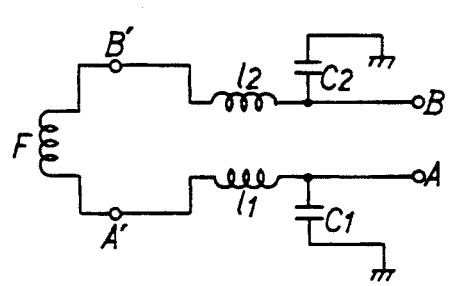

The filter circuit according to the present embodiment can be expressed as shown in FIG. 5A similarly with the circuit of FIG. 3A described above, wherein the choke coils 12 and 12, are expressed so as to be approached and an equivalent of such filter circuit as shown in FIG. 5B can be expressed similarly with an equivalent circuit as shown in FIG. 3B described above.

Figure 5C:
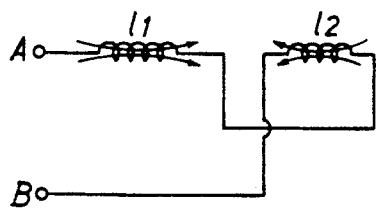

On the other hand, first and second choke coils $l_1$ and $l_2$ are wound in same direction together onto the core 11, whereby the input terminal A passes through the first choke coil $l_1$, and thereafter passing inversely through the second choke coil $l_2$ and then connected to the output terminal B, and thus the choke coils $l_1$ and $l_2$ can be expressed by an equivalent circuit of differentially connected inductor as shown in FIG. 5C thereby the heating phenomenon at the core 11 becomes remarkably decreased. Since direction of current flowing through the choke coil $l_1$ becomes opposite to the direction of current flowing through the choke coil $l_2$, the directions of inductive electrodes at the choke coils 1 and $l_2$ become opposite one another. According to the magnetic fluxes generated from the choke coils $l_1$ and $l_2$ are counterbalanced to each other. Therefore, the core heating phenomenon according to the input power can be suppressed.

Figure 5D:
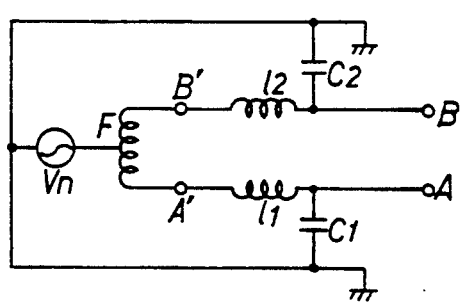

As shown in FIGS. 5A and 5D, the choke coils $l_1$ and $l_2$ show the choke coils 12 and 12' as shown in FIG. 4, and same parts or portions are shown by same reference numerals.

With reference to FIGS. 1 and 2 as well as FIGS. 5A to 5C, when the radio frequency noise generated from the operating space 7 flows inversely through a filament 8 to the input terminals A and B, an equivalent circuit of the filter circuit can be formed as shown in FIG. 5D.

Wherein, since the coils $l_1$ and $l_2$ are wound on the same axis of the core 11, the magnetic inductive coefficient L of the first and second choke coils $l_1$ and $l_2$ is the sum of the magnetic inductive coefficient by the coil $l_1$ and the magnetic inductive coefficient by the coil $l_2$, i.e., $L = l_1 + l_2$, whereby the filter circuit can be formed by only one choke coil.

The present embodiment as described above has the effect that the filter circuit using the unique core and the choke coil wound with as much as ½ of the conventional choke coils, is adapted not only to eliminate the radio frequency noise and decrease remarkably the heating phenomenon by the power supply, but also to reduce the volume of the filter box.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A magnetron for a microwave oven, comprising, a core;

a pair of choke coils wound around said core, both choke coils are wound in the same direction as a noise flowing direction of radio frequency noise generated from an operating space through a filament to a pair of input terminals for making a pair of output terminals disposed at one end portion thereof and said pair of input terminals disposed at another end portion thereof so that input currents to said pair of input terminals are inverse to each other in their flowing direction at a position where they pass through the core and noises are the same in their flowing direction; and a filter circuit constituted by connecting said input terminals of said choke coils to a lead-through capacitor and by connecting said output terminals of said choke coils to a center lead and a peripheral lead, respectively.

2. The magnetron according to claim 1, wherein said choke coils are wound in the same direction together so as the magnetic inductive coefficients thereof to be counterbalanced one another so that the input and output terminals are respectively located at the same side.

* * * * *